Figure 1:
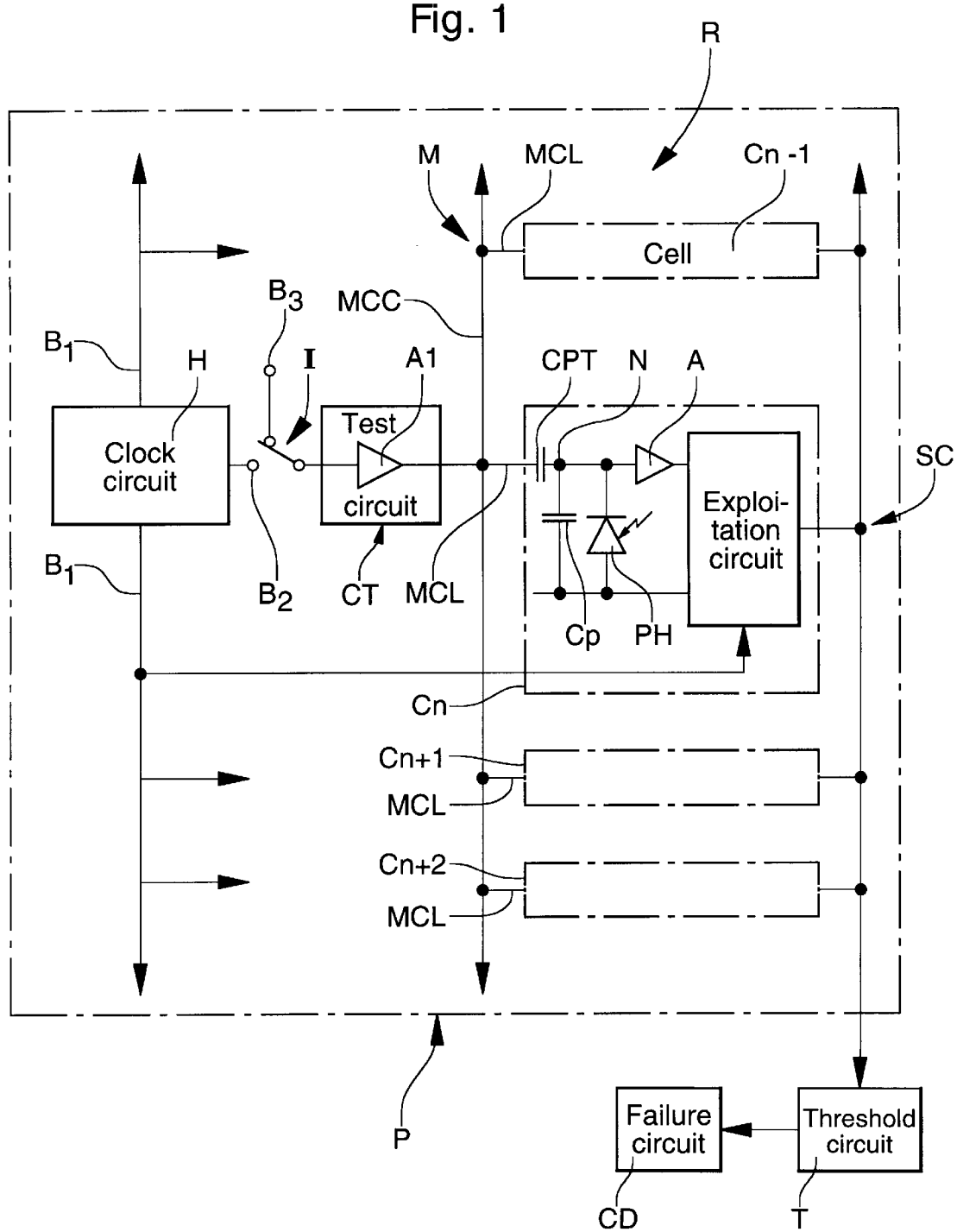

United States Patent
Grandjean

[11] Patent Number: 6,037,578
[45] Date of Patent: Mar. 14, 2000

[54] INTEGRATED PHOTOSENSOR USING TEST CAPACITOR TO TEST FUNCTIONING OF PHOTOSENSOR IN THE DARK

[75] Inventor: André Grandjean, Cressier, Switzerland

[73] Assignee: EM Microelectronic-Marin SA, Marin, Switzerland

[21] Appl. No.: 09/105,700

[22] Filed: Jun. 26, 1998

[30] Foreign Application Priority Data

Jul. 15, 1997 [CH] Switzerland .............................. 1728/97

[51] Int. Cl.[7] .............................. H01L 27/14; H01L 31/18
[52] U.S. Cl. .................................. 250/208.2; 250/214 R; 324/158.1; 324/73.1
[58] Field of Search ............................. 250/208.2, 214 R; 324/73.1, 158.1, 500, 537, 538; 437/8

[56] References Cited

U.S. PATENT DOCUMENTS

| | | |
|---|---|---|
| 4,697,139 | 9/1987 | Gal ........................................ 324/73.1 |
| 4,768,073 | 8/1988 | Adams . |
| 4,924,589 | 5/1990 | Leedy . |
| 5,371,352 | 12/1994 | Yoshida . |
| 5,483,155 | 1/1996 | Kannegundla et al. . |

FOREIGN PATENT DOCUMENTS 0 523 784 A1  7/1992  European Pat. Off. .

OTHER PUBLICATIONS

Arreguit, Xavier F., Et Al "A CMOS Motion Detector System for Pointing Devices" I.E.E.E. Journal of Solid-State Circuits, vol. 31, No. 12, Dec. 1996 (pp. 1916–1921).

Primary Examiner—Stephone B. Allen
Attorney, Agent, or Firm—Richard K. Robinson

[57] ABSTRACT

Photosensor comprising a network (R) of cells ( ... , Cn−1, Cn, Cn+1, Cn+2, ... ) each comprising a photosensitive component (PH) and an exploitation circuit (CE) for allowing the transfer of a measurement signal coming from the cell ( ... , Cn−1, Cn, Cn+1, Cn+2, ... ) and due to the illumination of this cell, to a common output (SC) of the photosensor. An addressing signal allows to sequentially connect all the cells to said common output. According to the invention, each cell also comprises an integrated conductive region (RC) forming together with said photosensitive component (PH) a test capacitor (CPT) which is coupled to the parasite capacitor (CP). In view of testing said photosensitive components (PH) in the dark, it also comprises means (H, CT, M) integrated on the chip (P) for applying, in synchronism with the selective applying of said addressing signal, to said test capacitor (CPT) a test pulse provoking a transfer of charge from said test capacitor (CPT) towards the parasite capacitor (CP). This simulates the illumination of the diode, and generates on the common output (SC), instead of said measurement signal, a signal representative of the functioning of the cell thus addressed.

7 Claims, 2 Drawing Sheets

INTEGRATED PHOTOSENSOR USING TEST CAPACITOR TO TEST FUNCTIONING OF PHOTOSENSOR IN THE DARK

The present invention concerns photoelectric sensors comprising a network of photosensitive cells so as to allow the analysis of information contained in a luminous signal impacting on the sensor.

The photosensor of this type currently on the market is realised on a chip in the form of an integrated circuit, each cell of the network comprising a photodiode and an exploitation circuit of the signal provided by the photodiode. This exploitation circuit is intended to produce an output signal which may be transferred to a common output of the sensor, thanks to a sequential addressing device connected to all of the cells and capable of, during the repetitive work cycles, to transfer one after the other all the output signals of the exploitation circuits to the common output with the help of a clock signal.

The fabrication of such a photosensor in the form of an integrated circuit chip is generally performed on a silicon wafer on which, by way of lithographic procedures which are usual for the semiconductor industry, one may obtain simultaneously a large number of identical sensors, all sensors comprising their own network of photosensitive cells.

It is normal practice to make the integrated circuit undergo a test to verify the correct functioning of each sensor after the fabrication, this test implying in particular the control of the photodiodes of each cell of the network of each sensor situated on the silicon wafer.

In order to carry out the test, the chips forming the sensors on the same wafer are brought successively in a classic integrated circuit check post to which must be added en independent light-source having a calibrated intensity. This source must be carefully positioned in front of each sensor, so that the source may illuminate it correctly at the moment of the test.

Thus, during the test, each sensor undergoes an exploration sequence of all the cells, the signal generated at the output of each of these cells by its photodiode is checked at a common output of the sensor so as to be compared with a predetermined threshold value. If a signal thus checked and corresponding to a determined diode is below this threshold, the cell is declared defect. The sensor itself is globally declared inapt if the number of cells which are defect is larger than a predetermined value.

This test procedure has an important inconvenience in that it requires a specifically arranged chip check post which must be constituted of a normal check post by adding an adequate light-source. However, it is very delicate to position the light-source correctly in the check post with respect to the integrated circuit to be tested in such a way as to obtain an equal illumination of all the sensors consecutively tested and also for all the cells of a same sensor, as an even small deviation with respect to the nominal position may result in a decision of being inapt, although the defect may not be inherent to the chip but to the instantaneous positioning of the light-source with respect to the corresponding sensor.

The invention has as object to provide a photosensor for which the test procedure may be carried out without major modifications of the test post and which has a small risk, or even zero risk of reject due to a measurement error during the test. Furthermore, the invention aims to provide a photosensor having a test circuit forming an integral part on the chip on which the sensor is realised ("circuit on-chip").

The invention thus has as object a photosensor of the type realised in the form of an integrated circuit chip comprising a network of cells each comprising a photosensitive component and an exploitation circuit connected to this component for allowing the transfer of a measurement signal coming from the cell and due to the illumination of this cell, to a common output of the photosensor under the action of an addressing signal allowing to selectively and sequentially connect all the cells to said common output, said photosensitive component having an internal intrinsic parasite capacitor, characterised in that each cell further comprises an integrated conductive region forming together with said photosensitive component a test capacitor which is coupled to said parasite capacitor, and in that in view of testing said photosensitive components in the dark, the photosensor further comprises means integrated on the chip for, in synchronism with the selective applying of said addressing signal, applying to said test capacitor of each component a test pulse provoking a transfer of a predetermined quantity of charge from said test capacitor towards said parasite capacitor of the component, said predetermined quantity being equal to that with which this parasite capacitor would be charged if the photosensor were illuminated with a predetermined intensity, and thus generating on said common output, instead of said measurement signal, a signal representative of the functioning of the cell thus addressed.

Thus, thanks to the invention, it is possible to simulate the functioning of each photosensitive component without requiring to supply a precise quantity of light. On the contrary, the photosensors may be checked in the dark, removed from any light-source. Thus, any adjusting work and any source of measurement error in this respect are eliminated.

The invention has also as object a procedure of fabricating a photosensor as described hereabove, characterised in that it consists of further realising, during the steps of manufacturing for creating the photosensor structure:

a test amplifier common to all of the cells, a conductive region of predetermined dimensions above the photosensitive component (PH) of each of its cells, and a mesh of test conductors, which are all connected to each other and to said test regions and to the output of said test amplifier.

Figure 2:
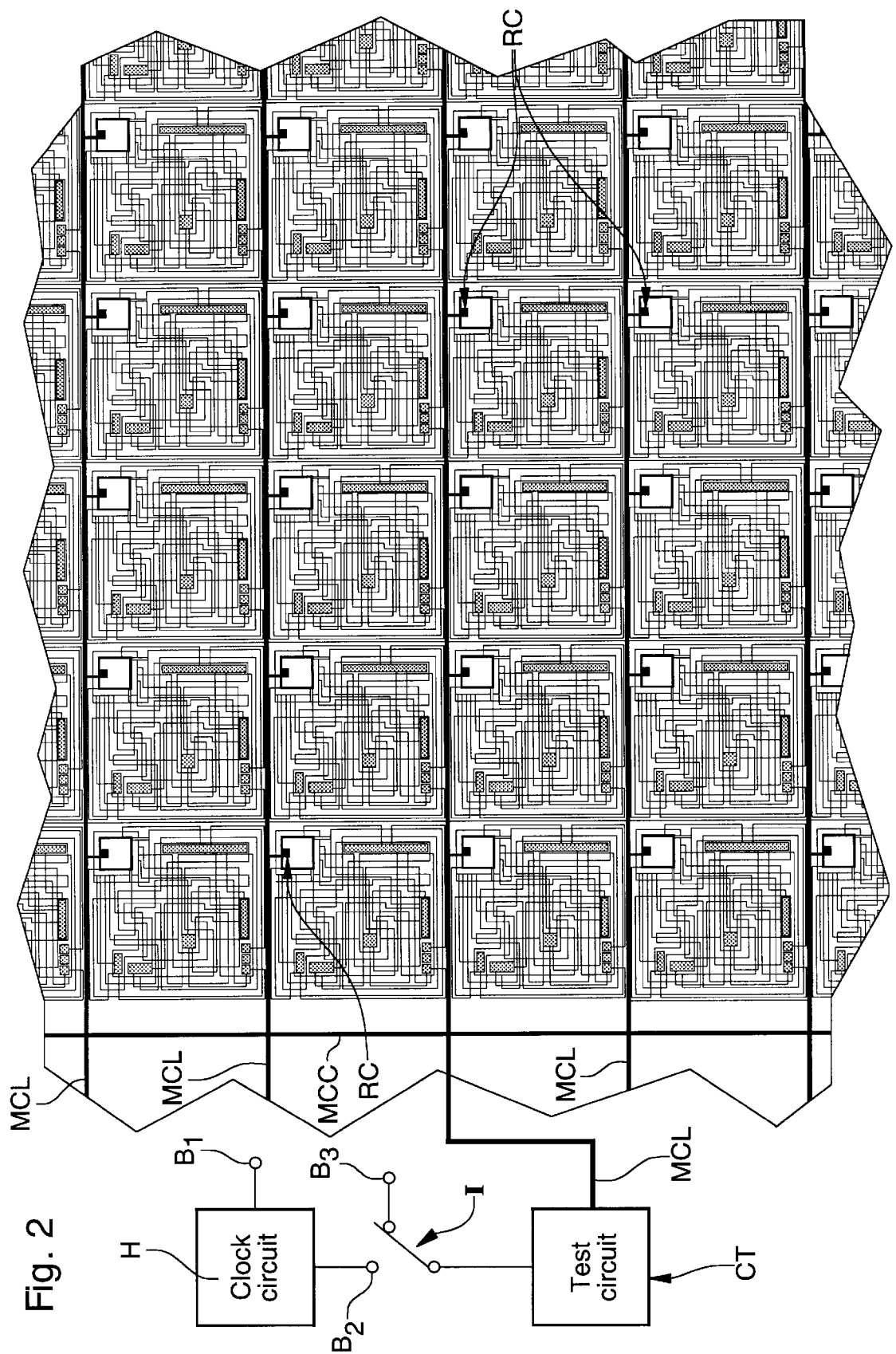

Other features and advantages of the invention will follow when reading the following description given solely by way of an example and in which reference will be made to the attached drawings in which:

FIG. 1 is a largely simplified bloc-diagram of a photosensor according to the invention, the bloc-diagram representing in particular the test means of the cells of the photosensor; and FIG. 2 is a diagram representing the topography of a part of a photosensor according to the invention equipped with its test means.

FIG. 1 represents a largely simplified bloc-diagram of a chip P presenting a network R of photosensitive cells . . . $C_{n-1}$, $C_n$, $C_{n+1}$, $C_{n+2}$ . . . which may be in total for example more than a hundred and which are arranged in rows and columns, FIG. 1 only representing one single column. The network may have any desired shape, an advantageous arrangement being that in which the whole network fits into a cercle.

Each cell ... Cn−1, Cn, Cn+1, Cn+2 ... (designated hereafter simply by the reference Cn) comprises a photodiode PH which is connected to an amplifier A having an output connected to an exploitation circuit CE. The latter is entrusted with appropriately processing the signal of the photodiode and ensuring the transmission of this signal of the photodiode, under the control of a clock signal, towards its output which is connected together with all the equivalent outputs of the other exploitation circuits of the cells of the network to a common output SC of the photosensor.

An example of a photosensitive sensor equipped with the cells of this type is described in an article by Xavier Arreguit et al in IEEE Journal of Solid State Circuits, Vol. 31, No 12, December 1996, to which reference is made for more detail. In this article, the photosensor is intended specifically to be used as a movement detector, in particular for a trackball controlled computer mouse. However, it should be noted that the present invention may be applied to any photosensor integrated on a chip and comprising a network of cells, each equipped with a photodiode or an equivalent photosensitive component.

Integrated circuit chip P is preferably fabricated simultaneously with other identical chips on a silicon wafer, by the usual photolithographical techniques, which are well-known to the specialists.

Besides the network R of individual cells Cn, the chip P further comprises a clock circuit H provided commonly to all the cells.

As can be seen, clock circuit H is connected by an output terminal B1 to each exploitation circuit CE of all the cells of chip P. This arrangement allows to send the clock signal, in a manner which is known as such and which is described in more detail in the above-mentioned article, as an addressing signal and according to a cyclic exploration procedure, to all the cells, one after the other, so that their exploitation circuits CE may provide at their turn during the addressing cycle, the useful signal at the common output SC during the time that the corresponding cell is activated.

According to the invention, the photosensor further comprises a test circuit CT provided commonly for all the cells. This circuit comprises an amplifier A1 for formatting pulses which may receive the clock signal coming from a terminal B2 of clock circuit H.

The output of amplifier A1 is connected to a mesh M of test conductors comprising, in the present example, a column conductor MCC to which are connected line conductors MCL which each serve all the cells of a row of the network R. The column conductor MCC runs along one of the edges of the cells network, whereas the line conductors MCL respectively extend along all the lines of the cells of the network of the photosensor (see also FIG. 2). All the conductors of mesh M are connected to each other, all the cells of the network are connected to the output of test amplifier A1.

In the bloc-diagram of FIG. 1, a parasite capacitor CP is represented in parallel to the photosensitive diode PH and which is inherent to the structure of each cell and to the structure of the integrated circuit of the chip constituting the photosensor. This parasite capacitor is normally considered as being a cumbersome element, but it is used in an advantageous manner by the present invention, as will be shown hereafter, without compromising the normal functioning of the photosensor.

According to another important aspect of the invention, the common node N between diode PH, the input of amplifier A and the parasite capacitor CP of the diode is connected to the conductor mesh M, i.e. to the output of amplifier A1, via a test capacitor CPT.

This test capacitor is formed by a conductive region RC provided above the photosensitive diode PH of each cell of the network and is obtained by lithography at the end of the fabrication of the chip, for example at the same time as the conductor mesh M. The regions RC forming the test capacitor are clearly shown in FIG. 2. The dimension of each conductive region RC is determined in such a manner that the capacitor it forms with the diode PH is about 1% of the parasite capacitor CP of this diode. In particular, the value of the test capacitor CPT may be around several femtofarads ($10^{-15}$ F).

It should be noted that the input of amplifier A1 is connected to an interrupter I which allows to selectively connect this input to the output B2 of clock circuit H for carrying out the test and to a voltage terminal B3 allowing, during the normal functioning of the photosensor, to neutralise amplifier A1 and thus the conductor mesh M and the conductive regions RC which are connected to this. It is this position of interrupter I which is represented in FIG. 1. Naturally, interrupter I may be obtained in the way of an integrated transistor forming part of test circuit CT. Furthermore, it may be understood that the transistor as well as terminal B3, may be replaced by external bondpads comprising a grounded resistor.

Interrupter I is controlled in such a way as to connect clock circuit H to amplifier A1, the test of the photosensor may be carried out in a standard check post for integrated circuits by proceeding to sequentially explore all the cells as if a measurement of the light impacting on the photosensor were performed. However, the test is carried out in the dark in such a manner that the cells Cn cannot produce an electric signal due to a possible illumination.

Thus, when the cells Cn of a determined photosensor positioned on an integrated circuit are successively addressed by the addressing system of the photosensor, the clock pulse which is amplified and formatted by amplifier A1, generates at the output of this amplifier the calibrated test pulse which injects via the test capacitor CPT a predetermined quantity of charge into parasite capacitor CP of the cell Cn which is addressed at the concerned instant. The ratio of the values of the two capacitors and the calibration of the test pulse are determined in such a manner that the quantity of charge across the parasite capacitor corresponds to a use of the photosensor with a nominal illumination which corresponds to that when the photosensor is used normally.

This signal thus generated by an addressed cell is transferred to the common output SC.

The latter may be connected to a threshold circuit T to verify if the diode PH of the addressed cell Cn functions correctly. The considered diode is declared defect, if the signal at the common output SC does not achieve the threshold. A failure counter CD connected to the output of the threshold circuit T allows to evaluate the result of all the measurements thus carried out during a test of a photosensor. It is thus possible to evaluate the correct functioning, a predetermined number of defect cells allowing to discard the considered photosensor.

It may thus be seen that the test of the photosensors does not require any illumination in the check post, i.e. no adjustment is required of a light-source with respect to the integrated circuit wafer on which the photosensor is fabricated.

It should further be noted that the test of the correct functioning of photosensors may be realised on a wafer comprising a large number of chips which are successively tested. But it is also possible to carry out this test on chips which are already separated from the integrated circuit wafer, for example by assembling them on a reel which is arranged to pass through the check post, in a manner well-known in the field of semiconductors.

What is claimed is:

1. A photosensor of the type realised in the form of an integrated circuit chip comprising a network of cells each comprising a photosensitive component and an exploitation circuit connected to this component for allowing the transfer of a measurement signal coming from the cell and due to the illumination of this cell, to a common output of the photosensor under the action of an addressing signal allowing to selectively and sequentially connect all the cells to said common output, said photosensitive component having an internal intrinsic parasite capacitor, wherein each cell further comprises an integrated conductive region forming together with said photosensitive component a test capacitor which is coupled to said parasite capacitor, and wherein in view of testing said photosensitive components in the dark, the photosensor further comprises means integrated on the chip for, in synchronism with the selective applying of said addressing signal, applying to said test capacitor of each component a test pulse provoking a transfer of a predetermined quantity of charge from said test capacitor towards said parasite capacitor of the component, said predetermined quantity being equal to that with which this parasite capacitor would be charged if the photosensor were illuminated with a predetermined intensity, and thus generating on said common output, instead of said measurement signal, a signal representative of the functioning of the cell thus addressed.

2. A photosensor according to claim 1, wherein the conductive regions of all the cells are connected to a mesh formed of conductors integrated on said chip and all connected to the output of a common test amplifier whose input is connected to receive in synchronism with said addressing signal, a succession of pulses which generate, at the output of the test amplifier ($A1$) the test pulses for the cells tested one after the other.

3. A photosensor according to claim 2, further comprising, integrated on said chip, a clock circuit, for generating said addressing signal in synchronism with said test pulses.

4. A photosensor according to claim 3, wherein the test amplifier is connected to said clock circuit by the intermediate of a switch for establishing a connection between said clock circuit and said test amplifier only when a test must be carried out.

5. A photosensor according to claim 4, wherein said switch is connected so as to allow, during normal functioning of the photosensor, the application of a neutral signal to said test amplifier to neutralise said mesh of conductors and said conductive regions.

6. A photosensor according to claim 1, wherein said photosensitive component is a diode and said conductive region constitutes together with said diode a test capacitor having a value which is about 1% of that of the parasite capacitor of said diode.

7. A procedure of fabricating a photosensor according to any one of the claims 1 to 6, which consists of further realising, during the steps of manufacturing for creating the photosensor structure:

a test amplifier common to all of the cells, a conductive region of predetermined dimensions above the photosensitive component of each of its cells, and a mesh of test conductors which are all connected to each other and to said test regions and to the output of said test amplifier.

* * * * *